(12) United States Patent
Hochi et al.

(10) Patent No.: US 11,691,869 B2
(45) Date of Patent: Jul. 4, 2023

(54) ELECTRONIC APPARATUS INCLUDING SEMICONDUCTOR PACKAGE

(71) Applicant: DENSO CORPORATION, Kariya (JP)

(72) Inventors: Suguru Hochi, Kariya (JP); Hideki Terasawa, Kariya (JP); Shigeki Sakurai, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/473,746

(22) Filed: Sep. 13, 2021

(65) Prior Publication Data

US 2022/0081283 A1    Mar. 17, 2022

(30) Foreign Application Priority Data

Sep. 15, 2020    (JP) .................................. 2020-154596

(51) Int. Cl.
  *B81B 3/00*    (2006.01)
  *B81B 7/02*    (2006.01)
  *B81B 7/00*    (2006.01)

(52) U.S. Cl.
  CPC .......... *B81B 3/0021* (2013.01); *B81B 7/0032* (2013.01); *B81B 7/02* (2013.01); *B81B 2201/0235* (2013.01)

(58) Field of Classification Search
  CPC ....... B81B 3/0021; B81B 7/0032; B81B 7/02; B81B 2201/0235; B81B 7/0048; B81B 2201/0242; B81B 2201/0264
  See application file for complete search history.

(56) References Cited

U.S. PATENT DOCUMENTS

| | | | |
|---|---|---|---|
| 2010/0109103 A1* | 5/2010 | Tsao | B81B 7/0064 257/E23.114 |
| 2010/0295139 A1* | 11/2010 | Ly | B81B 7/0061 257/E23.002 |
| 2014/0374852 A1* | 12/2014 | Raleigh | B81B 7/0064 438/51 |
| 2016/0351731 A1 | 12/2016 | Tsukagoshi et al. | |

FOREIGN PATENT DOCUMENTS

JP    2007214440 A    8/2007

* cited by examiner

*Primary Examiner* — Yasser A Abdelaziez
(74) *Attorney, Agent, or Firm* — Maschoff Brennan

(57) ABSTRACT

An electronic apparatus includes a semiconductor package including a sensor unit that outputs a signal responding to an applied physical quantity, mounted on a mounting member. An island projected region is defined as a region in the mounting member obtained by projecting an outline of an island on which the sensor unit is mounted, and a part of or entire of the island projected region is configured as a through hole or a concave portion.

7 Claims, 7 Drawing Sheets

ELECTRONIC APPARATUS INCLUDING SEMICONDUCTOR PACKAGE

CROSS-REFERENCE TO RELATED APPLICATION

This application is based on and claims the benefit of priority from earlier Japanese Patent Application No. 2020-154596 filed Sep. 15, 2020, the description of which is incorporated herein by reference.

BACKGROUND

Technical Field

The present disclosure relates to an electronic control apparatus including a semiconductor package mounted thereon, in which a sensor unit that outputs a signal responding to an applied physical quantity is provided.

Description of the Related Art

Conventionally, an electronic control apparatus is disclosed which is provided with a sensor body including a sensor unit in a concave section and a semiconductor package mounted on a printed wiring board, including a protection member that seals the sensor unit while covering the sensor unit without touching with the sensor unit. The sensor unit is configured as a micro electro mechanical system (i.e. MEMS) which outputs a signal, when a predetermined physical quantity such as an acceleration factor, a pressure, an angular velocity is applied, responding to the applied physical quantity.

SUMMARY

The present disclosure provides an electronic apparatus including: a semiconductor package including a sensor unit that outputs a signal responding to an applied physical quantity, an island on which the sensor unit is mounted, a lead frame having a plurality of leads and a sealing resin that covers a part of the lead frame and the sensor unit; and a mounting member including a substrate having a front surface that faces the semiconductor package and a back surface, the semiconductor package being mounted on the mounting member via a bonding material.

DETAILED DESCRIPTION OF THE PREFERRED EMBODIMENTS

Conventionally, as an electronic apparatus, for example, patent literature JP-A-2007-214440 discloses an electronic control apparatus provided with a sensor body including a sensor unit in a concave section and a semiconductor package mounted on a printed wiring board, including a protection member that seals the sensor unit while covering the sensor unit without touching with the sensor unit.

The sensor unit is configured as a micro electro mechanical system (i.e. MEMS) which outputs a signal, when a predetermined physical quantity such as an acceleration factor, a pressure, an angular velocity is applied, responding to the applied physical quantity.

According to the above-described electronic control apparatus, since the sensor unit is disposed in a cavity, the sensor unit is unlikely to be influenced by a stress caused by a difference of the linear expansion coefficient between devices on the printed wiring board and the sensor body even it is used in an environment having large temperature change. Hence, the signal output is stable. Note that a use of the above-described apparatus is not limited, but may be an on-vehicle use such as vehicles, for example.

In recent years, in the field of this type of electronic apparatus, further downsizing is required. However, in the case where the sensor is configured to have a cavity, since the dimension of the semiconductor package in the thickness direction becomes large, further downsizing of the electronic apparatus cannot be accomplished.

With reference to the drawings, embodiments of the present disclosure will be described. Note that mutually the same or equivalent portions in the respective embodiments will be described with the same reference numbers applied thereto.

First Embodiment

With reference to FIGS. 1 to 4, an electronic apparatus 1 according to a first embodiment will be described.

Figure 1:
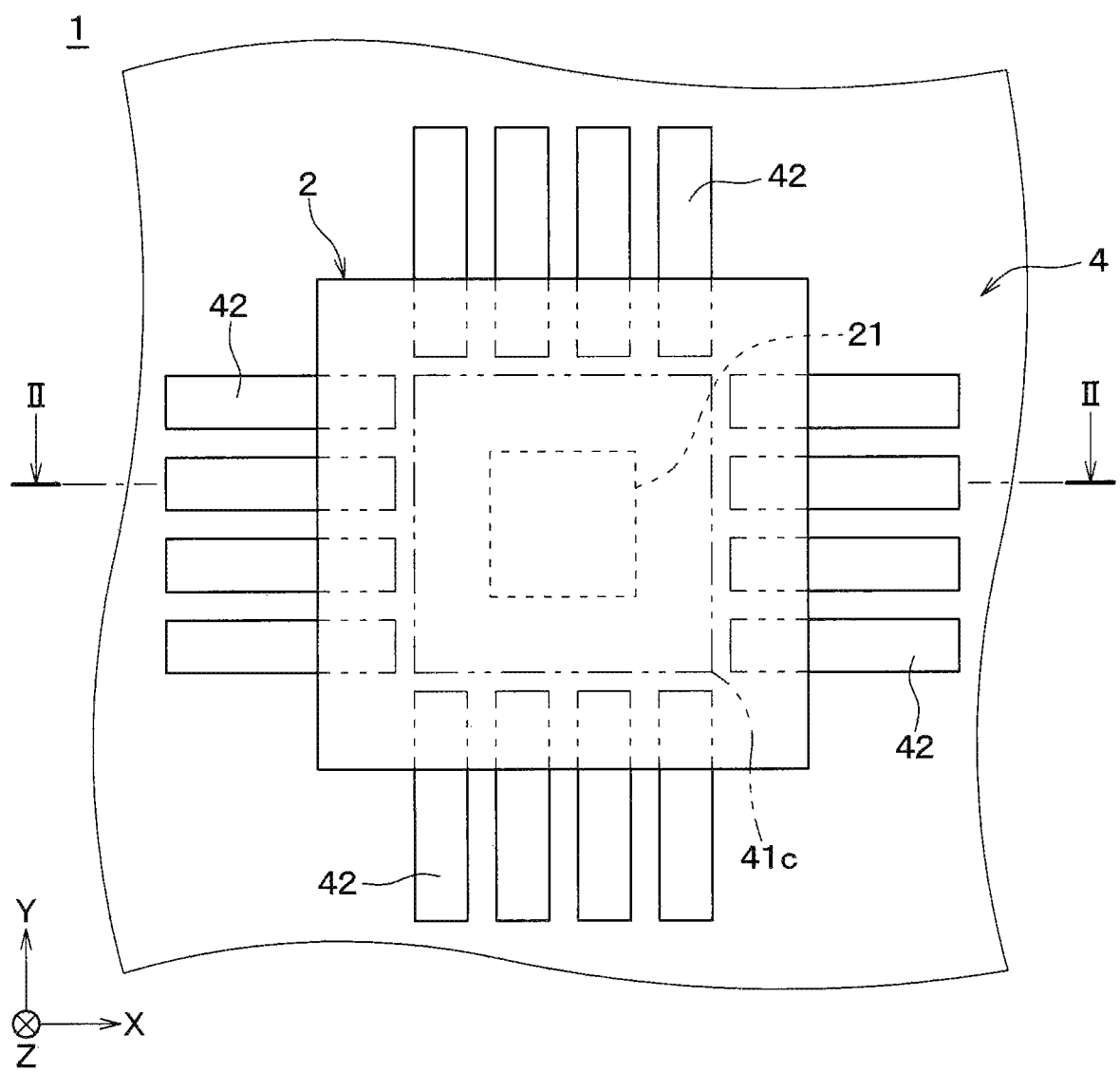
FIG. 1 is a diagram showing an upper surface of one example of an electronic apparatus according to a first embodiment of the present disclosure.
Figure 3:
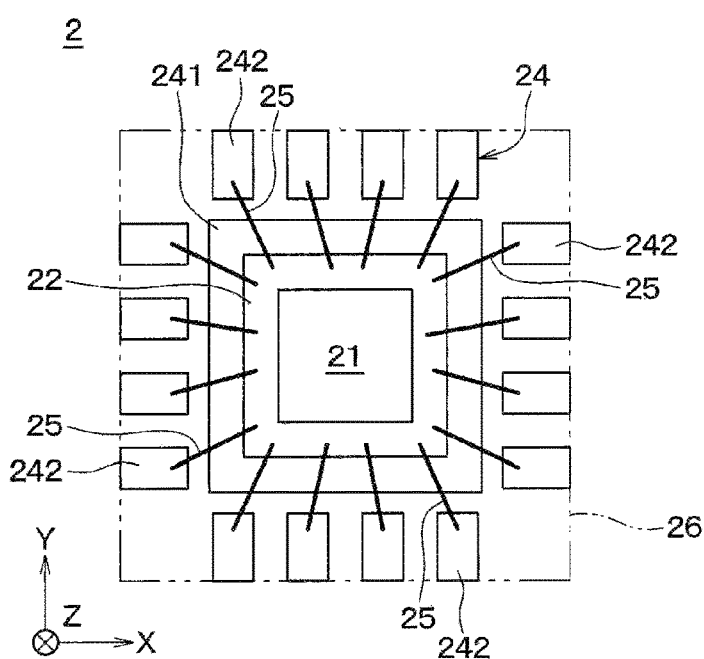
FIG. 3 is a plan view showing a semiconductor package in the electronic apparatus according to the first embodiment.

In FIG. 1, in order to view easily for recognizing the elements, a part of a land 42 and outline of an island projected region 41c in the mounting member 4 (described later), which are hidden by the semiconductor package 2 in top view, are shown with a two-dot chain line. Also, in FIG. 1, with the same purpose as described above, the outline of the sensor unit 21 which will be described later in the semiconductor package 2 is shown with a dotted line. In FIG. 3, for ease of illustration, the outline of the sealing resin 26 which will be described later in the semiconductor package 2 is shown with a two-dot chain line, and the outline of the respective elements arranged in the sealing resin 26 are shown with a solid line.

Hereinafter, for convenience of explanation, as shown with an arrow in FIG. 1, a direction towards the right on the paper surface is referred to as X direction, a direction orthogonal to the X direction on the same paper surface and towards the upper side on the paper surface is referred to as Y direction, and a direction orthogonal to a XY plane and towards the rear side of the paper surface is referred to as Z direction. In the drawings subsequent to FIG. 1, the directions X, Y, Z correspond to respective directions X, Y, Z shown in FIG. 1.

Figure 2:
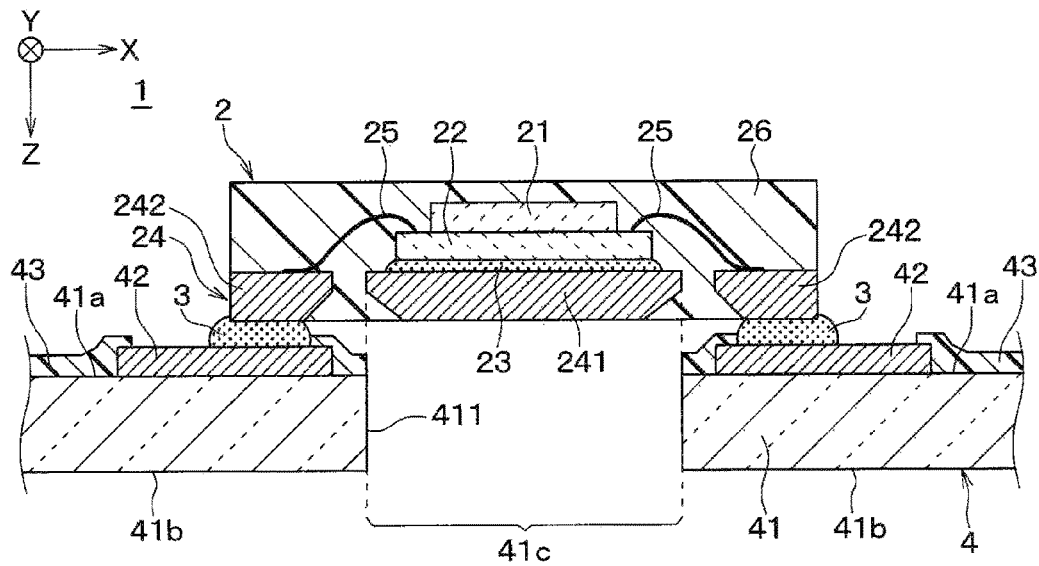
FIG. 2 is a cross-sectional view showing a cross section sectioned along the line II-II of FIG. 1.

An electronic apparatus 1 according to the present embodiment is provided with a semiconductor package 2 having a sensor unit 21 that outputs a signal responding to an applied physical quantity, and a mounting member 4 to which the semiconductor package 2 is mounted. For the electronic apparatus 1, for example, as shown in FIG. 2, the semiconductor package 2 is mounted on a mounting member 4 via a bonding material 3, and at least a region in the mounting member 4, which is immediately below the sensor unit 21 of the semiconductor package 2, is a through hole 411. Thus, the electronic apparatus 1 is configured such that the semiconductor package 2 does not come into contact with the mounting member 4 in the case where the semiconductor package 2 is curved towards the mounting member 4 with thermal deformation.

As shown in FIGS. 2 and 3, the semiconductor package 2 is provided with, a sensor unit 21, a signal processing unit 22, an adhesive material 23, an island 241, a lead frame 24 having a plurality of leads 242, a wire 25 and a sealing resin 26. In view of downsizing, as shown in FIG. 3, for example, the semiconductor package 2 is configured as a QFN (quad flat non-leaded package) structure in which all of the leads 242 are disposed inside the outline of the sealing resin 26. In other words, the semiconductor package 2 has a smaller planar size compared to that of a QFP (quad flat package) structure having outer leads protruding from the sealing resin 26. Hence, the structure of the semiconductor package 2 is suitable for downsizing the electronic apparatus 1.

The sensor unit 21 is an electronic component in which a MEMS sensor that outputs a signal responding to physical quantity applied externally is formed on a substrate made of Si (silicon) or a glass. When the sensor unit 21 is a MEMS sensor, the semiconductor package 2, that is, the electronic apparatus 1, can be further downsized. The sensor unit 21 functions as, for example, an inertial sensor such as an acceleration sensor and an angular velocity sensor, and outputs, when various physical quantity such as the acceleration factor, the angular velocity and the like are applied, a signal responding to the physical quantity. The sensor unit 21 is configured as, for example, as shown in FIG. 2, a semiconductor element disposed on the signal processing unit 22 and connected to electrodes (not shown) of the signal processing unit 22 with any method such as a thermal bonding. Thus, the sensor unit 21 is configured such that the output signal to be outputted responding to the physical quantity when being applied, is transmitted to the signal processing unit 22.

In the present specification, a case will be described as a typical example in which the sensor unit 21 is configured as an acceleration sensor outputting a signal responding to an acceleration factor in a thickness direction of the semiconductor package 2, that is, Z direction. However, this is not limited to this example.

Figure 4:
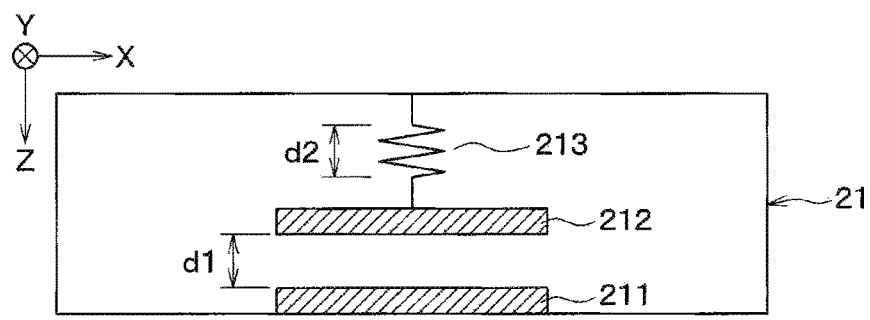
FIG. 4 is an explanatory diagram showing a function when the semiconductor package serves as an acceleration sensor.

When the sensor unit 21 is configured as an acceleration sensor that detects an acceleration factor in the Z direction, that is, the gravitational acceleration, for example, as shown in FIG. 4, the sensor unit is an electrostatic capacitance detection type MEMS sensor including a fixed electrode 211, a movable electrode 212, and a spring member 213. In this case, the sensor unit 21 is configured to output a signal responding to a change in the electrostatic capacitance based on a change in the distance d1 between the fixed electrode 211 and the movable electrode 212. For example, the electrostatic capacitance C (unit: F) between the fixed electrode 211 and the movable electrode 212 which have the same area S (unit: $m^2$) is calculated by the following equation (1), where the dielectric constant of the dielectric between the electrodes 211 and 212 is ε(unit: F/m).

$$C = \varepsilon \cdot S / d1 \quad (1)$$

where mass of the movable electrode 21 serving as a weight is nn (unit: kg), the spring constant of the spring member 213 is k (unit: N/nn), and a moving distance of the movable electrode 212 is d2 (unit: nn) as shown in FIG. 4.

Here, the acceleration a in the Z direction applied to the sensor unit 21 is calculated by the following equation (2).

$$\alpha = k \cdot d2 / m \quad (2)$$

Specifically, the distance d1 between the fixed electrode 211 and the movable electrode 212 is calculated based on a change in the electrostatic capacitance C, and the moving distance d2 of the movable electrode 212 is calculated based on the distance d1, whereby the acceleration a in the Z direction applied to the sensor unit 21 can be calculated. For example, the sensor unit 21 is configured such that the outer surface in the fixed electrode 211 side shown in FIG. 4 is bonded to the signal processing unit 22, and the output signal thereof is directly transmitted to the signal processing unit 22 via a wiring connected to the fixed electrode 211.

As a detection method of the acceleration factor of the acceleration sensor, a piezoresistance method and a thermal detection method can be used other than the electrostatic capacitance detection method. Since the sensor unit 21 of the electrostatic capacitance detection method can be accomplished by stable material such as glass or Si, the sensor characteristics in a temperature in an environment of the sensor unit 21 is stabilized. Hence, electrostatic capacitance detection method has superior temperature characteristics compared to other methods.

For example, the signal processing unit 22 is an electronic component provided with an integrated circuit (IC) which is not shown, processing the output signal transmitted from the sensor unit 21, and that is a semiconductor element. For example, the signal processing unit 22 is configured to convert an analog signal outputted by the sensor unit 21 into a digital signal and output the converted digital signal externally. As shown in FIG. 3, in the signal processing unit 22, wires 25 are connected to electrodes (not shown), and a plurality of leads 242 are electrically connected to the signal processing unit 22 via the wires 25. Thus, the signal processed by the signal processing unit 22 is transmitted externally via the leads 242. As shown in FIG. 2, the signal processing unit 22 is mounted on the island 241 by the adhesive material 23, for example.

For the adhesive material 23, for example, any materials which are generally used in a semiconductor packaging area can be used.

The lead frame 24 is provided with the island 241 on which the signal processing unit 22 and the sensor unit 21 are mounted, and the plurality of leads 242 separated from the island 241. The lead frame 24 is made of, for example, any conductive materials including metals such as Cu (copper), Fe (iron) and composite materials thereof. For the lead frame 24, the island 241 and the plurality of leads 242 are coupled by a tie bar (not shown) or the like before the forming process of the sealing resin 26, and after forming the sealing resin 26, a coupled portion is cut and removed by a punching process or the like, thereby separating the coupled portion.

As shown in FIG. 2, for the island 241, a surface on which the signal processing unit 22 is mounted and an opposite surface are exposed from the sealing resin 26. Note that the island 241 has a symmetric shape such as rectangular shape where the center thereof in the top view is defined as the axis, and the island 241 is disposed such that the center thereof is overlapped with the center of the sensor unit 21. However, the configuration is not limited thereto.

As shown in FIG. 2, for the plurality of leads 242, a first surface on which the wire 25 is connected and a second surface opposite to the first surface are exposed from the sealing resin 26, serving as connection terminals to the mounting member 4. For the plurality of leads 242, a side surface connecting the first surface and the second surface, being opposite to a surface facing the island 241 is exposed from the sealing resin 26. As shown in FIG. 3, the plurality of leads 242 are arranged with a distance from the island 241 and apart from each other to surround the island 241.

Note that the number of islands 241 and the leads 242 which constitute the lead frame 24, the size and arrangement of the islands 241 and the leads 242 are not limited to the configurations shown in FIGS. 2 and 3, but may be appropriately modified.

The wires 25 are each composed of any conductive material such as Au (gold) and each connected to the signal processing unit 22 and the lead 242.

The sealing resin 26 is composed of any insulated resin material such as epoxy resin, and formed by any resin molding method such as a compression molding.

The sealing resin 26 touches all the area of the sensor unit 21 excluding a portion in the island 241 side. In other words, the sealing resin 26 is configured not to include a cavity for disposing the sensor unit 21 inside the semiconductor package 2. That is, the semiconductor package 2 is configured as a QFN structure in which the sensor unit 21 is fully molded by the sealing resin 26.

The bonding material 3 is made of any conductive bonding material used for bonding the semiconductor package 2 to the mounting member 4, such as solder.

In order to distinguish the members and for the sake of convenience, a member for mounting the signal processing unit 22 onto the island 241 is referred to as an adhesive material 23, and a member for mounting the semiconductor package 2 onto the mounting member 4 is referred to as a bonding material 3. However, these materials may be formed of the same material.

As shown in FIG. 2, the mounting member 4 is provided with a substrate 41 having a front surface 41*a* and a back surface 41*b*, a land 42 formed on the front surface 41*a*, and an insulation layer 43. The mounting member 4 is, for example, a printed circuit board. The mounting member 4 is not limited to the printed circuit board but may be any member as long as the semiconductor package 2 can be mounted. For the mounting member 4, a region where the outline of the island 241 is projected along a normal line, with respect to the front surface 41*a* of the substrate 41, is referred to as an island projected region 41*c*. All the area of the island projected region 41*c* is formed as a through hole 411 which connects the front surface 41*a* and the back surface 41*b*. In other words, the mounting member 4 has a region as a through hole 411, which is produced by projecting, in the Z direction, the outline of the island 241 provided with the sensor unit 21 mounted thereon, that is, a region located immediately below the island 241. This structure prevents the semiconductor package 2 from coming into contact with the mounting member 4 when the semiconductor package 2 is curved towards the mounting member 4 because of temperature change, and stabilizes the sensor characteristics of the sensor unit 21. This structure will be detailed later.

The substrate 41 is a plate-like member made of any insulation material such as glass epoxy resin, for example. As shown in FIG. 2, the substrate 41 includes the land 42 and the insulation layer 43 that covers at least a part of the front surface 41*a*, in the front surface 31*a* side as a surface for mounting the semiconductor package 2.

The substrate 41 can be configured such that the back surface 41*b* side is exposed, but it is not limited to this configuration. The substrate 41 may be configured such that the land 42 and the insulation layer 43 are provided in the back surface 41*b* side.

The land 42 is made of any conductive material such as Cu, and used for boding with other members. For example, the land 42 is constituted such that the one end side is bonded to the lead 242 of the semiconductor package 2 via the bonding material 3, and the other end side is bonded to a wiring which is not shown. Note that the number of lands 42, and the size and the shape of the lands 42 may be appropriately modified depending on an arrangement of the lead 42 of the semiconductor package 2.

The insulation layer 43 covers at least a part of the front surface 41*a* of the substrate 41 and the land 42, and is made of any insulation resin material. The insulation layer 43 may be a solder resist generally used in a field of electronic substrates.

The basic configuration of the electronic apparatus 1 according to the present embodiment is described in the above.

(Effects and Advantages)

Figure 5A:
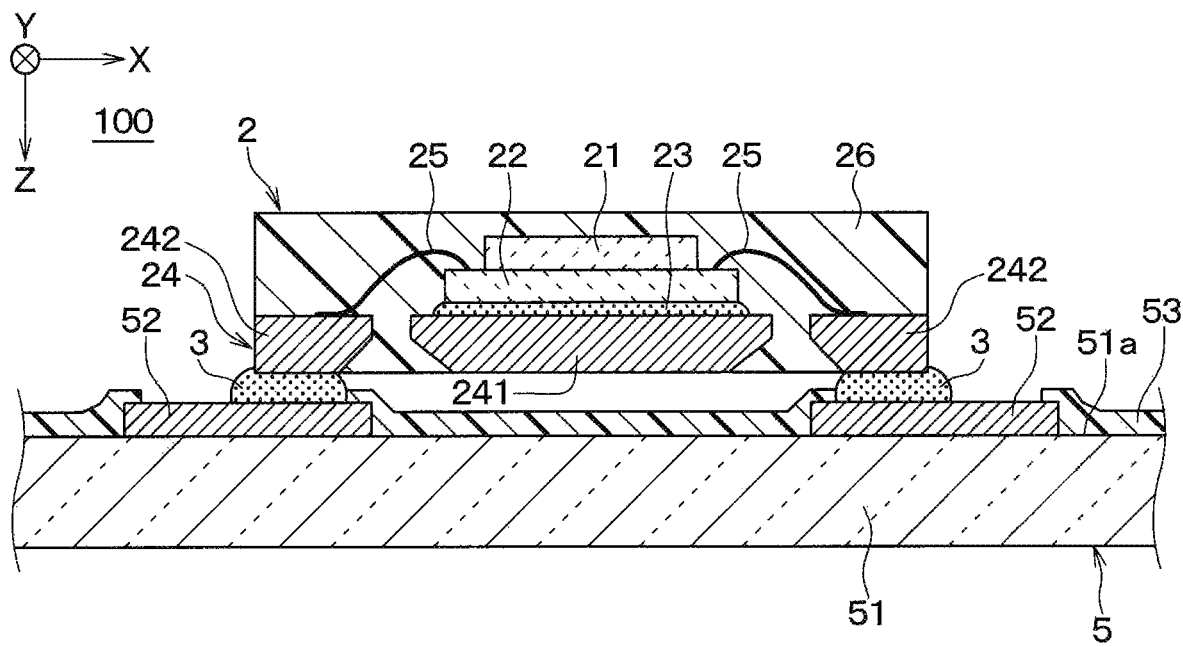
FIG. 5A is a diagram corresponding to FIG. 2, showing a cross-sectional view of an electronic apparatus of a comparative example.
Figure 6:
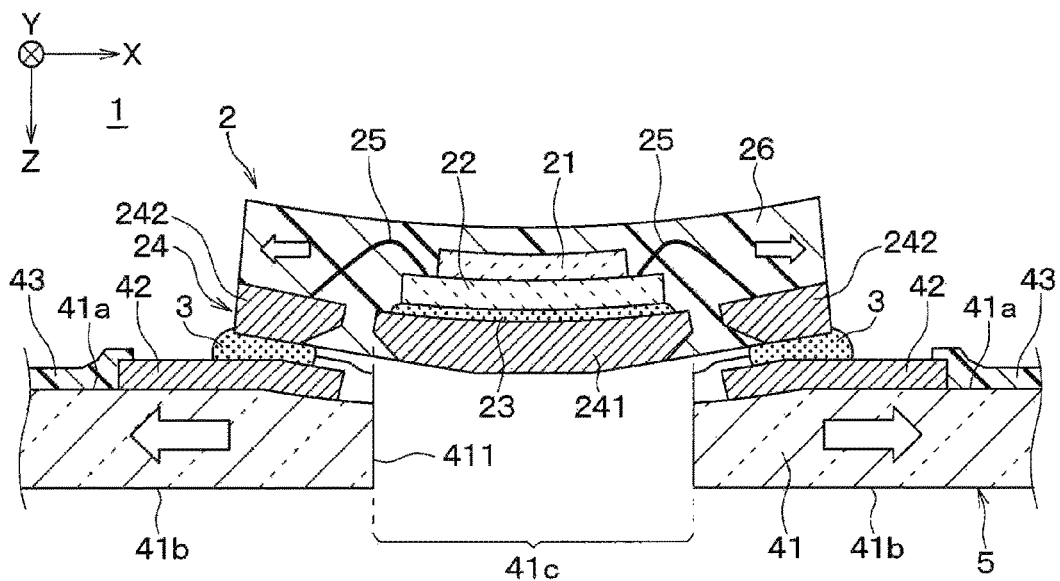
FIG. 6 is a cross-sectional view showing a state where the semiconductor package is curved due to thermal deformation, approaching a portion of a member to be mounted
Figure 7:
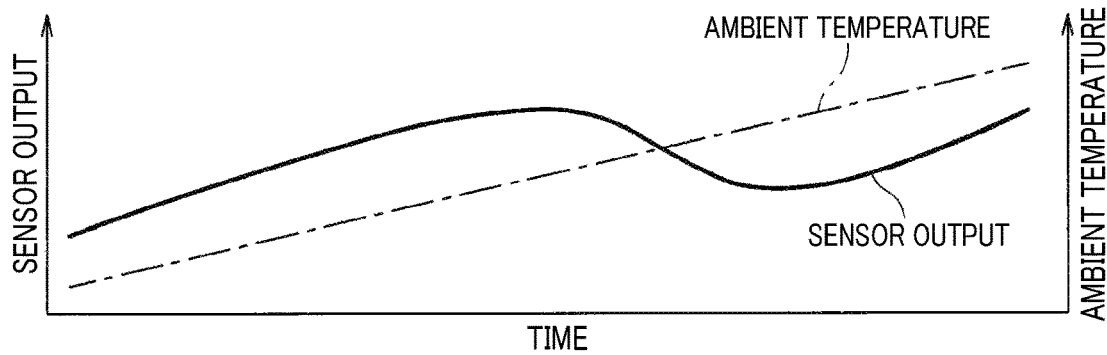
FIG. 7 is a graph showing a relationship between the sensor output of the electronic apparatus of the first embodiment, an ambient temperature and the time, in which an example of the sensor output of the semiconductor package is shown.
Figure 8:
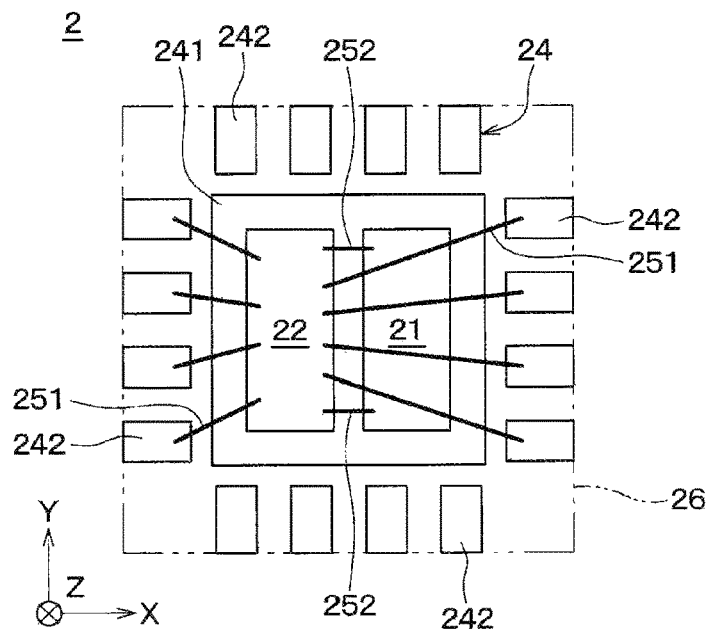
FIG. 8 is a plan view showing a semiconductor package of a modification example of an electronic apparatus according to the first embodiment.

The effects and advantages of the electronic apparatus 1 according to the present embodiment will be described with reference to FIGS. 6 and 7. Firstly, with reference to FIGS. 5A to 5D, a problem in an electronic apparatus according to a comparative example (conventional art) will be described. The electronic apparatus 100 according to the comparative example is configured such that a QFN type semiconductor package 2 without through hole is mounted on the printed circuit board 5.

Figure 5B:
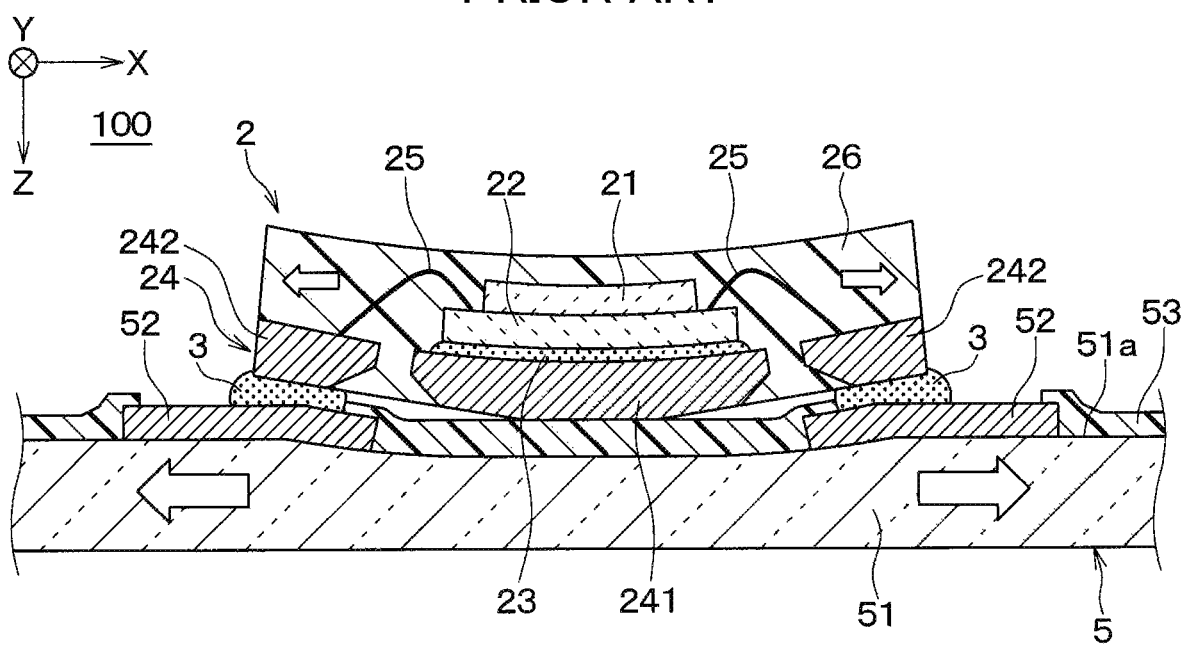
FIG. 5B is a cross-sectional view showing a state where the semiconductor package in the electronic apparatus of the comparative example is curved due to thermal deformation, approaching the printed circuit board, and a part of the semiconductor package contacts with the printed circuit board.
Figure 5C:
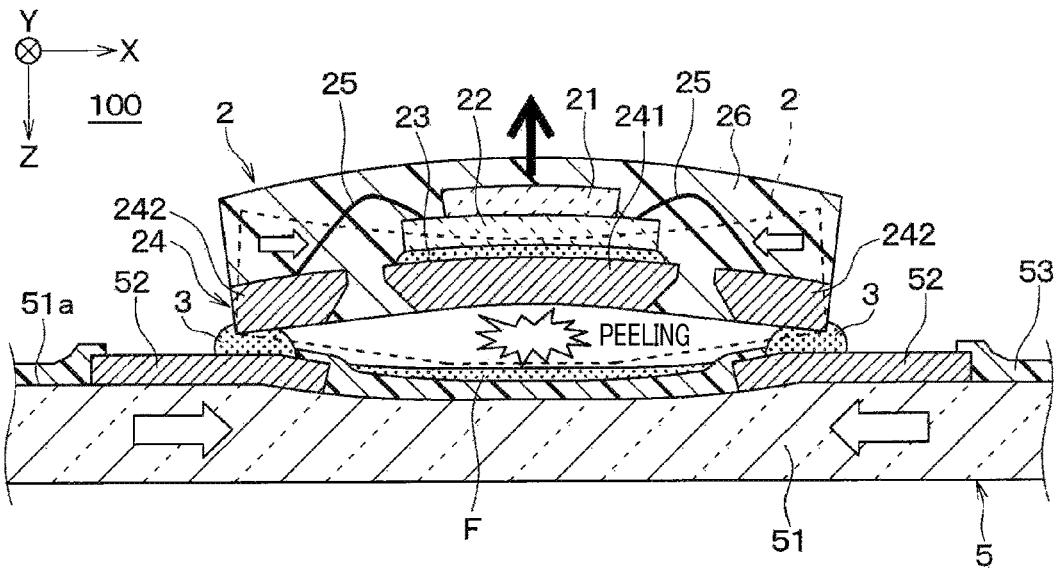
FIG. 5C is a cross-sectional view showing a state where the semiconductor package in the electronic apparatus of the comparative example is curved due to thermal deformation, away from the printed circuit board, and a flux is present on the printed circuit board.

In FIGS. 5B and 5C, the white arrow indicates a direction where the semiconductor package 2 and the printed circuit board 5 are expanded or contracted with a temperature in an environment of the electronic apparatus 100 according to the comparative example. Hereinafter, for the sake of convenience, the temperature in an environment of the electronic apparatus 100 according to the comparative example, or the electronic apparatus 1 according to the present embodiment is referred to as ambient temperature.

Figure 5D:
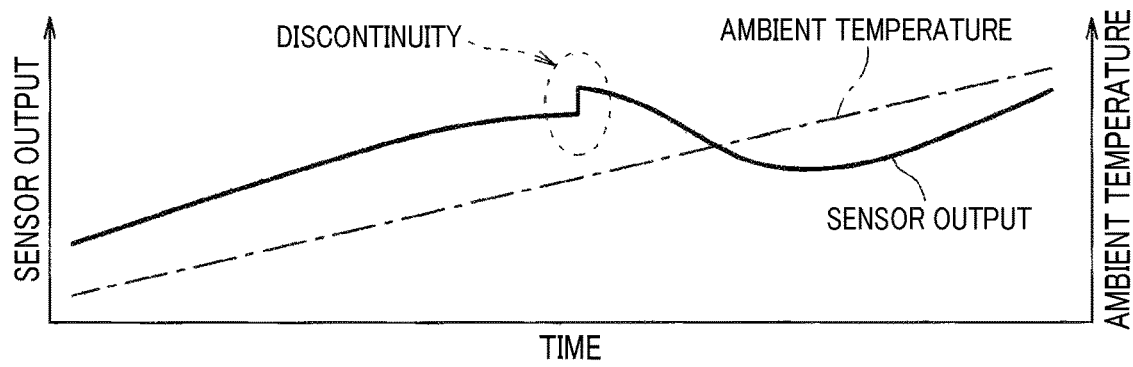
FIG. 5D is a graph showing a relationship between the sensor output of the electronic apparatus of the comparative example, an ambient temperature and the time, in which the sensor output of the semiconductor package shows a discontinuous portion as an example.

In FIG. 5C, a dotted line indicates an outline of the semiconductor package 2 in a state where the semiconductor package 2 comes into contact with the printed circuit board 5. In FIG. 5D, for ease of illustration, the solid line indicates a graph showing the sensor output corresponding to a left side vertical axis, and the one dot chain line indicates a graph showing the ambient temperature corresponding to a right side vertical axis. The same applies to FIG. 7.

As shown in FIG. 5A, for example, the electronic apparatus 100 according to the comparative example is configured such that the QFN structured semiconductor package is bonded to the printed circuit board 5 via the bonding material 3. The printed circuit board 5 is composed of a flat plate-shaped substrate 51, a copper foil 52 disposed on the front surface 51a of the substrate 51, and a solder resist 53 that covers at least a part of the front surface 51a and the copper foil 52. The substrate 51 is made of any insulation material such as glass epoxy resin, and the concave section and the through hole are not provided in a region immediately below the semiconductor package 2.

The ambient temperature which will be described below is not limited to the normal temperature, but may be an air temperature ranging from 15 deg. C. to 25 deg. C., for example. A high temperature is not limited to any value, but may be a temperature exceeding a normal air temperature (e.g. 50 deg. C. or higher). Further, a low temperature is not limited to any value, but may be a temperature below a normal air temperature (e.g. 0 deg. C. or lower).

In the electronic apparatus 100 according to the comparative example, when the ambient temperature changes from the normal temperature to the high temperature, as indicated by the white arrow in FIG. 5B, the semiconductor package 2 and the printed circuit board 5 are expanded with the heat. At this time, a degree of thermal expansion of the printed circuit board 5 is larger than that of the semiconductor package 2 with the difference of the linear expansion coefficient between materials of the constituents thereof. As a result, in the semiconductor package 2, one surface between the outer front surfaces thereof positioned in the printed circuit board 5 side is curved to be in a convex shape, and the island 241 including the sensor unit 21 mounted thereon comes into contact with the printed circuit board 5 as shown in FIG. 5B.

The inventors have discovered, through diligent research into the electronic apparatus 100 of the comparative example, that the accuracy of the sensor is lowered and a discontinuity of the sensor output which will be described later occurs because of abutting and peeling between the semiconductor package 2 and the printed circuit board 5.

Specifically, in the case where the semiconductor package 2 comes into contact with the printed circuit board 5, an impact occurring when the semiconductor package 2 comes into contact with the printed circuit board 5 is propagated to the sensor unit 21, and noise may be produced on the output signal from the sensor unit 21. Also, in the state where the semiconductor package 2 is in contact with the printed circuit board 5, in the sensor unit 21, the fixed electrode 211 which is close to the printed circuit board 5 is more prevented from being deformed compared to the variable electrode 212 which is farther from the printed circuit board 5 than the fixed electrode 211 is. Thus, even in the case where the physical quantity is not applied, in the sensor unit 21, the distance d1 between the fixed electrode 211 and the variable electrode 212 becomes small, whereby the trend of the output signal changes and the accuracy of the sensor may be lowered.

On the other hand, in the electronic apparatus 100 according to the comparative example, when the ambient temperature changes from the normal temperature to the low temperature, as indicated by the white arrow in FIG. 5C, the semiconductor package 2 and the printed circuit board 5 are contracted with the drop in temperature. At this time, a degree of thermal contraction of the printed circuit board 5 is larger than that of the semiconductor package 2 with the difference of the linear expansion coefficient between materials of the constituents thereof. As a result, in the semiconductor package 2, the other surface opposite to the one surface between the outer front surfaces thereof is curved to be in a convex shape, and deformed receding from the printed circuit board 5.

Here, as a result of inventor's research, when a solder is used as a bonding material 4, it is found that the accuracy of the sensor unit 21 of the semiconductor package 2 is significantly lowered.

Specifically, when using a solder as the boding material 3, for example, as shown in FIG. 5C, a flux F may be flowing into a region immediately below the semiconductor package 2 in the printed circuit board 5. As described above, when the semiconductor package 2 comes into contact with the printed circuit board 5, the semiconductor package 2 is temporarily stuck to the printed circuit board 5 by the flux F having adhesiveness. Thereafter, when the ambient temperature becomes low, the semiconductor package 2 is temporarily prevented from being deformed with the stuck flux F, but when a degree of deformation reaches a certain level, the semiconductor package 2 detaches from the flux F and is deformed, rapidly separating from the printed circuit board 5. At this moment, an unintended force is applied to sensor unit 21 other than the physical quantity from outside when the semiconductor package 2 is peeled off from the flux F, which is reflected to the output signal. Hence, as shown in FIG. 5D, a discontinuous portion occurs in the sensor output of the sensor unit 21.

In order to solve the above-described issues, the inventors of the present disclosure developed an electronic apparatus 1 configured such that portions other than the bonded portion in the semiconductor package 2 does not come into contact with the mounting member 4 even when the semiconductor package 2 is deformed because of the ambient temperature.

According to the electronic apparatus 1 of the present embodiment, an island projected region 41c in the mounting member, positioned immediately below the island 241 where the sensor unit 21 of the semiconductor package 2 is mounted, serves as a through hole 411. Hence, as shown in FIG. 6, for example, even when the semiconductor package 2 is curved in an arched shape approaching to the mounting member 4 side, since a portion in a convex shape of the semiconductor package 2 is positioned above the through hole 411, an unintended portion does not come into contact with the mounting member 4. Further, since the island projected region 41c serves as the through hole 411, even when the bonding material is a solder, the flux F does not flow into a portion immediately below the semiconductor package 2 and does not stay in the portion immediately below the semiconductor package 2.

Accordingly, the electronic apparatus 1 of the present disclosure has a configuration in which the accuracy of the sensor unit 21 is improved compared to the above-described comparative example. Also, in the electronic apparatus 1, since an unintentional contact between the semiconductor package 2 and the mounting member 4 does not occur, even when a solder is used as the bonding material 3, for example, as shown in FIG. 7, the sensor output is stable and discontinuity of the sensor output does not occur.

Note that the semiconductor package may be configured to have a QFP structure and designed such that the thermal stress due to a difference of the linear expansion coefficients between the outer lead part protruding from the sealing resin and the mounting member is relaxed to prevent the semiconductor package from being deformed, thereby stabilizing the sensor output. However, in the case of the QFP structure, since the planar size becomes larger due to the outer lead part, it may be insufficient to satisfy a requirement of downsizing the electronic apparatus.

In contrast, the electronic apparatus 1 according to the present embodiment has a QFN structure for the semiconductor package 2. Hence, since the outer lead protruding from the outline of the sealing resin 26 is not present, the planar size of the apparatus is smaller than that of the QFP structure.

According to the present embodiment, the semiconductor package 2 having QFN structure is mounted to the mounting member 4 in which the through hole 411 is the island projected region 41c positioned immediately below the island 241 where the sensor unit 21 is mounted, thereby constituting the electronic apparatus. Thus, even in the case where the semiconductor package 2 is deformed because of the ambient temperature, the semiconductor package 2 does not unintentionally come into contact with the mounting member 4. Therefore, both of the downsizing of the electronic apparatus and a stable sensor output can be accomplished.

Modification of First Embodiment

The sensor unit 21 may be disposed not on the signal processing unit 22, but disposed a distance away from the signal processing unit 22 and mounted to another region in the island 241 other than a region where the signal processing unit 22 is mounted. In this case, the sensor unit 21 is electrically connected to the signal processing unit 22 at an electrode portion (not shown) via a second wire 252. Note that a first wire 251 connects between the signal processing unit 22 and the lead 242. Thus, the output signal from the sensor unit 21 is transmitted to the signal processing unit 22 via the second wire 252.

Figure 9:
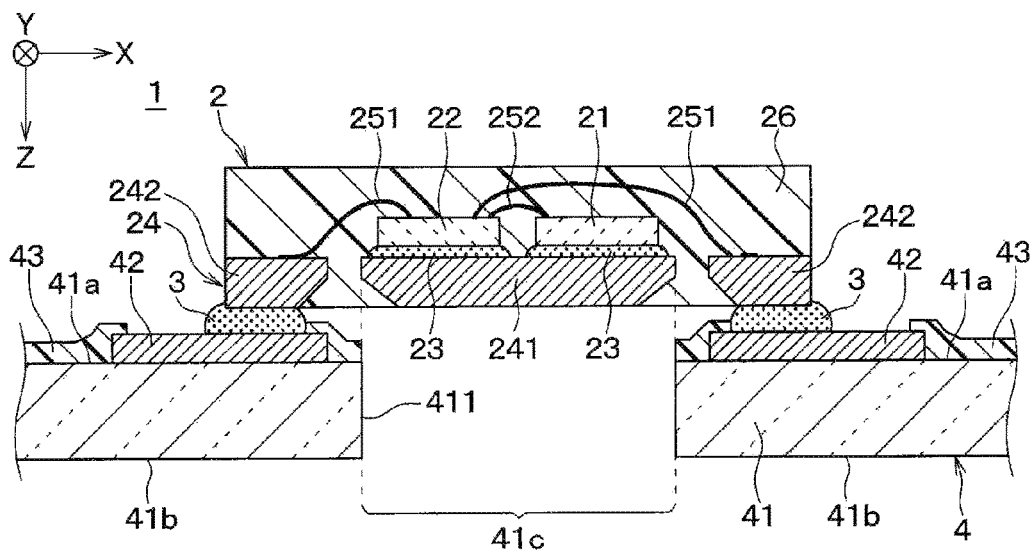
FIG. 9 is a diagram corresponding to FIG. 2, showing a cross-sectional view of a modification example of an electronic apparatus according to the first embodiment.

For the mounting member 4, similar to the above-described embodiment, for example, as shown in FIG. 9, the through hole 411 is defined as an island projected region 41c produced by projecting, in the Z direction, the outline of the island 241 provided with the sensor unit 21 mounted thereon.

According to the present modification, the same effect and advantages as those in the above-described first embodiment can be obtained.

Second Embodiment

An electronic apparatus 1 according to the second embodiment will be described with reference to FIG. 10 and FIG. 11.

Figure 10:
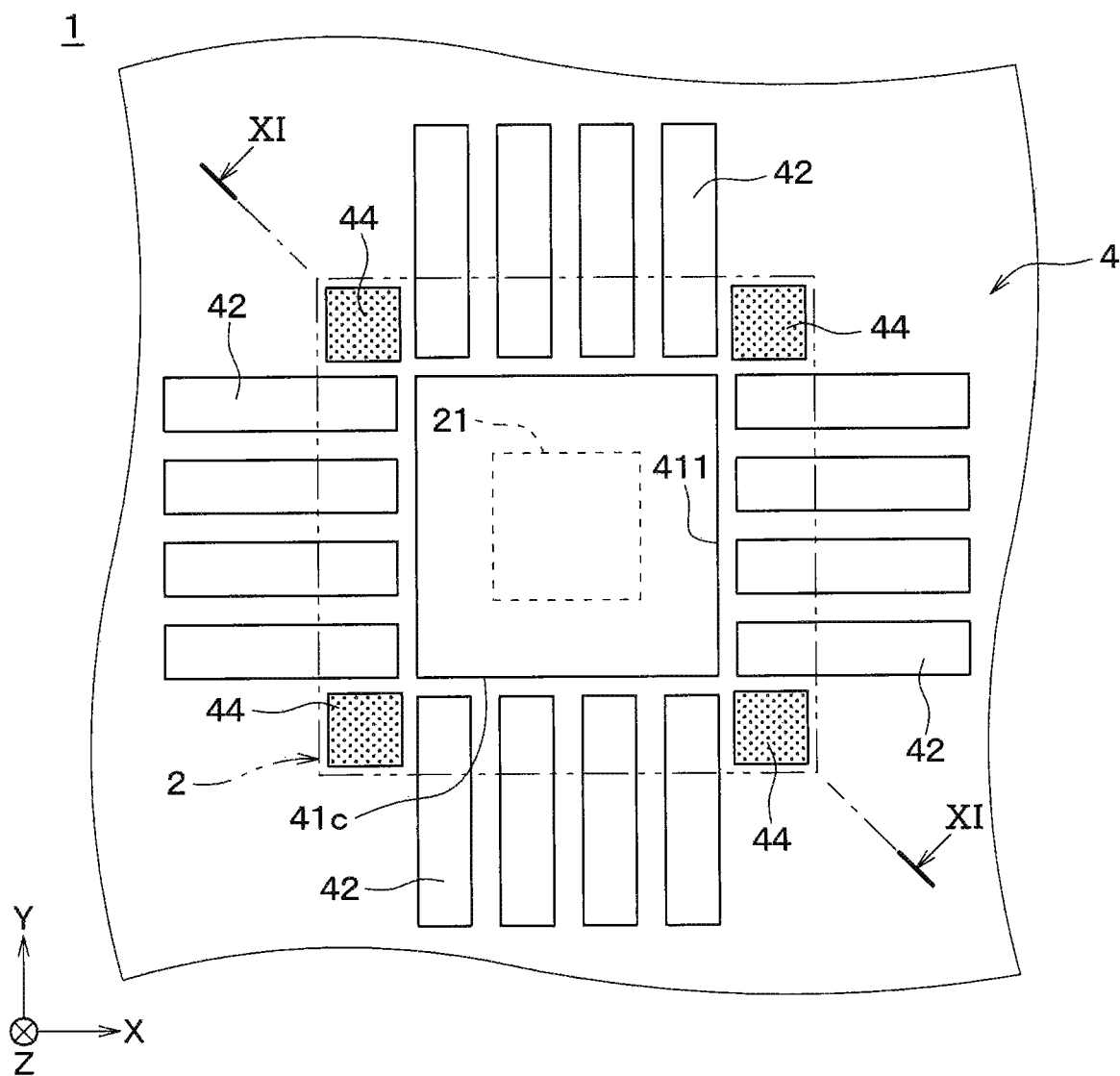
FIG. 10 is a a diagram showing an upper surface of an example of an electronic apparatus according to a second embodiment.

In FIG. 10, in order to easily recognize the structure of the convex portion 44 (described later) in the mounting member 4, the outline of the semiconductor package 2 is indicated by a two-dot chain line, the outline of the sensor unit 21 is indicated by a dotted line, and a hatching is applied to the convex portion 44. Note that this hatching does not indicate a cross-section.

The electronic apparatus 1 according to the present embodiment differs from the first embodiment in that the mounting member 4 further includes a convex portion 44 used for adjusting a gap between the semiconductor package 2 and the substrate 41. According to the present embodiment, this difference will be mainly described.

The convex portion 44 is a member for adjusting a gap such that the distance between the semiconductor package 2 and the substrate 41 is a predetermined distance or more when mounting the semiconductor package 2 on the mounting member 4. The convex portion 44 further prevents the semiconductor package 2 and the substrate 41 from coming into contact with each other when the semiconductor package 2 is deformed due to changes in the ambient temperature.

For the convex portion 44, for example, as shown in FIG. 10, a plurality of convex portions 44 are arranged in a region in the substrate 41 which is formed by projecting the outline of the semiconductor package 2 in the Z direction, that is, a region immediately below the semiconductor package 3 and a region positioned outside the island projected region 41c. Hereinafter, to simplify the explanation, the above-described region where the convex portions 44 are arranged within a region of the substrate 41 where the outline of the semiconductor package 2 is projected in the Z direction, may be referred to as convex portion arrangement portion. For example, four convex portions 44 are arranged to support the four corner portions of the semiconductor package 2. However, it is not limited to this configuration as long as the gap between the semiconductor package 2 and the substrate 41 are adjusted, and the number of portions, the planar size, the height, the shape or the arrangement may be appropriately changed.

The height of the convex portion 44 in the convex portion arrangement region of the substrate 41 may be set corresponding to a predetermined distance or less such that a bonding failure does not occur between the semiconductor package 2 and the substrate 41 while protruding in the Z direction from other portions such as the land 42 and the insulation layer 43.

Figure 11:
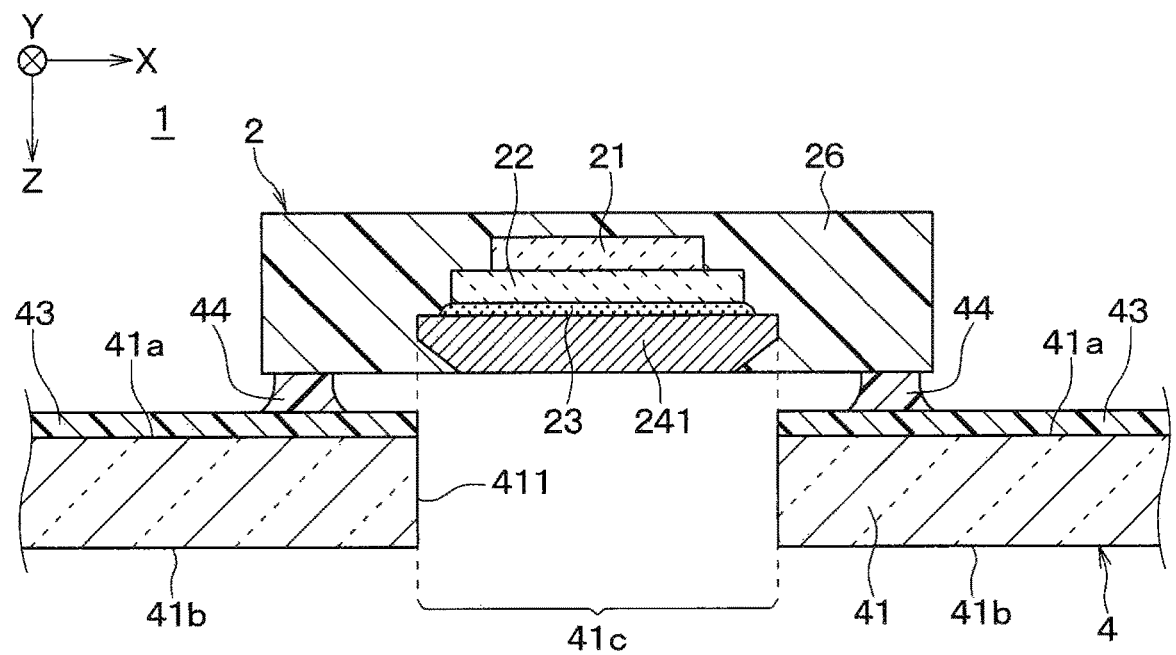
FIG. 11 is a cross-sectional view of a cross-section sectioned along the line XI-XI of FIG. 10.

For example, as shown in FIG. 11, the convex portion 44 is formed on the insulation layer 23. In this case, the convex portion 44 is formed using an insulation material which is film-formed by any method such as a dispenser coating or a silk printing. Note that the under coating of the convex portion 44 is not limited to the insulation layer 23, but may be any coating such as a laminate of a dummy land and the insulation layer 43, and the substrate 41.

According to the present embodiment, in addition to the configuration in which the island projected region 41c of the mounting member 4 is the through hole 411, the convex portion 44 is provided for adjusting the gap. Hence, the semiconductor package 2 is unlikely to come into contact with the mounting portion 4, thereby further improving the effects and advantages obtained from the first embodiment.

Third Embodiment

Figure 12:
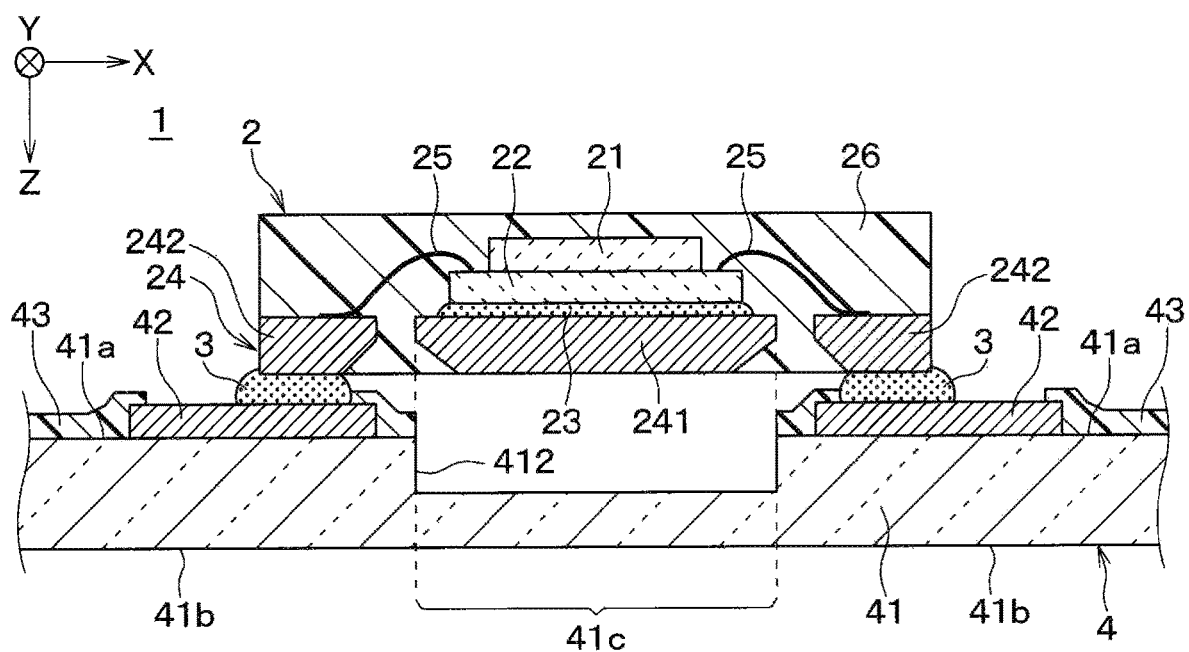
FIG. 12 is a diagram corresponding to FIG. 2, showing an example of an electronic apparatus according to a third embodiment.

An electronic apparatus according to the third embodiment will be described with reference to FIG. 12.

The electronic apparatus 1 according to the present embodiment differs from the first embodiment in that the island projected region 41c in the mounting member 4 is the concave portion 412. According to the present embodiment, this difference will be mainly described.

The mounting member 4 according to the present embodiment is configured as a concave portion 412 in which entire island projected region 41c is recessed from the front surface 41a of the substrate 41 towards the back surface 41b of the substrate 41. Thus, the semiconductor package is prevented from coming into contact with the substrate 41 because the island projected region 41c is configured as the convex portion 412, even when it is curved towards the substrate 41 side because of an influence of the ambient temperature. For the concave portion 412, the depth, the shape and the planar size of may be appropriately changed, as long as the concave portion 412 is required to be configured such that the semiconductor package 2 curved towards the substrate 41 side does not come into contact with the substrate 41. In the case where the island projected region 41c is the concave portion 412, when using a solder as the boding material 3, the flux F stays in the bottom portion of the concave portion 412, but never come into contact with the semiconductor package 2.

According to the present embodiment, effects and advantages similar to those in the first embodiment can be obtained from the electronic apparatus 1 of the present embodiment.

Other Embodiments

The present disclosure has been described in accordance with the embodiments. However, the present disclosure is not limited to the embodiments and structure thereof. The present disclosure includes various modification examples and modifications within the equivalent configurations. Further, various combinations and modes and other combinations and modes including one element or more or less elements of those various combinations are within the range and technical scope of the present disclosure.

For example, according to the above-described respective embodiments, examples are described in which the entire island projected region 41c in the mounting portion 4 is configured as the through hole 411 or the concave portion 412. However, it is not limited to these examples. Specifically, the island projected region 41c may have a shape in which the semiconductor package 2 and the substrate 51 do not come into contact with each other when the semiconductor 2 is curved towards the substrate 41 side. Hence, a part of the island projected region 41c may be configured as the through hole 411 or the concave portion 412. For example, the though hole 411 or the concave portion 412 may be configured as a region positioned immediately below a predetermined region in the island projected region 41c including the center of the island 241 where the sensor unit 21 is mounted, or a part of a predetermined region immediately below the sensor unit 21.

Conclusion

The present disclosure has been achieved in light of the above-described circumstance, and provides an electronic apparatus including a semiconductor package provided with a sensor unit outputting a signal responding to an applied physical quantity. The electronic apparatus accomplishes both of downsizing of the electronic apparatus and stable output of the sensor unit.

As a first aspect, the present disclosure provides an electronic apparatus including: a semiconductor package including a sensor unit that outputs a signal responding to an applied physical quantity, an island on which the sensor unit is mounted, a lead frame having a plurality of leads and a sealing resin that covers a part of the lead frame and the sensor unit; and a mounting member including a substrate having a front surface that faces the semiconductor package and a back surface, the semiconductor package being mounted on the mounting member via a bonding material. An island projected region is defined as a region in the substrate obtained by projecting an outline of the island along a normal line with respect to the front surface, and a part of or entire of the island projected region is configured as a through hole that connects between the front surface and the back surface, or configured as a concave portion recessed from the front surface towards the back surface.

Thus, according to the electronic apparatus of the present disclosure, even in a case where a stress due to a difference of thermal expansion or contraction between the semiconductor package and the mounting member occurs and causes the semiconductor package to be curved towards the mounting member side, the semiconductor package is prevented from coming into contact with the mounting member because of the curved shape thereof. Specifically, a part of or entire region in the mounting member immediately below the island where the semiconductor package is mounted, is configured as a through or a concave portion, whereby the semiconductor package does not come into contact with the mounting member when being curved and the sensor output is stabilized. Further, since the electronic apparatus is structured such that the semiconductor package, when being curved, does not come into contact with the mounting member, a cavity portion for disposing the sensor unit in the semiconductor package is not required to be provided. Hence, the electronic apparatus can be downsized in the thickness direction. Therefore, both of downsizing of the electronic apparatus and stable output of the sensor unit can be accomplished.

What is claimed is:

1. An electronic apparatus comprising:
 a semiconductor package including a sensor unit that outputs a signal responding to an applied physical quantity, an island on which the sensor unit is mounted, a lead frame having a plurality of leads and a sealing resin that covers a part of the lead frame and the sensor unit; and
 a mounting member including a substrate having a front surface that faces the semiconductor package and a back surface, the semiconductor package being mounted on the mounting member via a bonding material,
 wherein
 an island projected region is defined as a region in the substrate obtained by projecting an outline of the island along a normal line with respect to the front surface,
 a part of or entire of the island projected region is configured as a through hole that connects between the front surface and the back surface, or configured as a concave portion recessed from the front surface towards the back surface,
 the sensor unit is a semiconductor element provided with a MEMS sensor, and
 the sensor unit is provided with a fixed electrode and a variable electrode, and outputs a signal responding to an electrostatic capacitance between the fixed electrode and the variable electrode.

2. The electronic apparatus according to claim 1, wherein the sensor unit is configured to output a signal responding to a physical quantity applied in a direction along a thickness direction of the semiconductor package.

3. The electronic apparatus according to claim 1, wherein the mounting member is a printed circuit board.

4. The electronic apparatus according to claim 1, wherein the semiconductor package is disposed such that all of the leads are disposed inside an outline of the sealing resin.

5. The electronic apparatus according to claim 4, wherein the sensor unit is disposed such that portions excluding a surface facing the island come into contact with the sealing resin.

6. The electronic apparatus according to claim 1, wherein the sensor unit is disposed such that a center of the sensor unit is overlapped with a center of the island; and
the island is configured such that an outline of a surface on which the sensor unit is mounted has a symmetric shape of which the axis is the center of the island.

7. An electronic apparatus comprising:
a semiconductor package including a sensor unit that outputs a signal responding to an applied physical quantity, an island on which the sensor unit is mounted, a lead frame having a plurality of leads and a sealing resin that covers a part of the lead frame and the sensor unit; and
a mounting member including a substrate having a front surface that faces the semiconductor package and a back surface, the semiconductor package being mounted on the mounting member via a bonding material,
wherein
an island projected region is defined as a region in the substrate obtained by projecting an outline of the island along a normal line with respect to the front surface,
a part of or entire of the island projected region is configured as a through hole that connects between the front surface and the back surface, or configured as a concave portion recessed from the front surface towards the back surface, and
the mounting member includes a plurality of convex portions in a region immediately below the semiconductor package and a region positioned outside the island projected region, the plurality of convex portions protruding in a direction towards the front surface from the back surface.

* * * * *